United States Patent
Tatsukawa et al.

(10) Patent No.: US 7,928,823 B2
(45) Date of Patent: Apr. 19, 2011

(54) LAMINATED CERAMIC ELECTRONIC COMPONENT AND METHOD FOR PRODUCING THE SAME

(75) Inventors: Tsuyoshi Tatsukawa, Takefu (JP); Keisuke Takayama, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 610 days.

(21) Appl. No.: 10/531,522

(22) PCT Filed: Nov. 18, 2004

(86) PCT No.: PCT/JP2004/017173
§ 371 (c)(1),
(2), (4) Date: Nov. 21, 2007

(87) PCT Pub. No.: WO2005/052962
PCT Pub. Date: Jun. 9, 2005

(65) Prior Publication Data
US 2009/0278649 A1 Nov. 12, 2009

(30) Foreign Application Priority Data

Nov. 28, 2003 (JP) ................................ 2003-400222
Jun. 16, 2004 (JP) ................................ 2004-178056

(51) Int. Cl.
*H01F 5/00* (2006.01)
*H01F 27/29* (2006.01)
*H01F 27/28* (2006.01)
*H01F 7/06* (2006.01)

(52) U.S. Cl. ........ 336/200; 336/192; 336/223; 336/232; 29/602.1

(58) Field of Classification Search ................ None
See application file for complete search history.

(56) References Cited

U.S. PATENT DOCUMENTS

| | | | | |
|---|---|---|---|---|
| 5,250,923 A | * | 10/1993 | Ushiro et al. | 336/83 |
| 5,392,019 A | * | 2/1995 | Ohkubo | 336/200 |
| 6,115,264 A | * | 9/2000 | Nosaka | 361/821 |
| 6,169,470 B1 | * | 1/2001 | Ibata et al. | 336/83 |

(Continued)

FOREIGN PATENT DOCUMENTS

JP        06-069040 A        3/1994

(Continued)

OTHER PUBLICATIONS

Official Communication issued in corresponding Korean Patent Application No. 10-2005-7007241, dated Jul. 26, 2006.
Official Communication issued in corresponding Japanese Patent Application No. 2005-515763, drafted on May 2, 2006.

*Primary Examiner* — Anh T Mai
*Assistant Examiner* — Mangtin Lian
(74) *Attorney, Agent, or Firm* — Keating & Bennett, LLP

(57) ABSTRACT

A laminated ceramic electronic component includes a plurality of conductor pattern layers for a coil arranged to overlap each other to form substantially U-shaped conductors for the coil. The conductors for the coil are electrically connected in series through via holes for inner layer connection provided in ceramic green sheets to form a spiral coil. A plurality of leading conductor pattern layers also overlaps each other to form leading conductors. One leading conductor pattern layer is disposed per a predetermined number of conductor pattern layers for the coil. An end of each leading conductor pattern layer is in contact with the corresponding conductor pattern layer for the coil. In other words, the thickness of the lead conductors is less than the thickness of the conductors for the coil.

9 Claims, 6 Drawing Sheets

U.S. PATENT DOCUMENTS

| | | |
|---|---|---|
| 6,194,248 B1 * | 2/2001 | Amaya et al. ............... 438/110 |
| 6,229,425 B1 * | 5/2001 | Kobayashi .................. 336/200 |
| 6,504,466 B1 * | 1/2003 | Katsurada ................... 336/200 |
| 6,597,270 B2 * | 7/2003 | Takashima et al. ............ 336/83 |
| 6,621,400 B2 * | 9/2003 | Horie ......................... 336/200 |
| 2002/0008606 A1 * | 1/2002 | Okuyama et al. ............ 336/200 |
| 2002/0067236 A1 | 6/2002 | Andoh et al. |
| 2002/0092599 A1 * | 7/2002 | Tokuda et al. ............. 156/89.12 |
| 2002/0140539 A1 * | 10/2002 | Takashima et al. .......... 336/200 |
| 2002/0144765 A1 * | 10/2002 | Tatsukawa et al. ........ 156/89.12 |
| 2003/0000622 A1 * | 1/2003 | Tokuda et al. ............. 156/89.12 |
| 2004/0084131 A1 * | 5/2004 | Konoue et al. ............ 156/89.11 |

FOREIGN PATENT DOCUMENTS

| | | |
|---|---|---|
| JP | 09-312232 A | 12/1997 |
| JP | 11-016759 A | 1/1999 |
| JP | 2000-058325 A | 2/2000 |
| JP | 2000-232202 A | 8/2000 |
| JP | 2001-126924 A | 5/2001 |
| JP | 2001-196228 A | 7/2001 |
| JP | 2001-307937 A | 11/2001 |
| JP | 2002-305123 A | 10/2002 |

* cited by examiner

LAMINATED CERAMIC ELECTRONIC COMPONENT AND METHOD FOR PRODUCING THE SAME

BACKGROUND OF THE INVENTION

1. Field of the Invention

The present invention relates to a laminated ceramic electronic component, and in particular, to a laminated ceramic electronic component such as a laminated inductor, a laminated impedance component, a laminated transformer, and a high frequency line device, and a method for producing the same.

2. Description of the Related Art

In general, a laminated ceramic electronic component such as a laminated inductor is produced as follows. Firstly, a mother ceramic laminated block including a plurality of ceramic laminated products is formed. The mother ceramic laminated block is cut according to the arrangement of inner conductors, such as conductors for a coil and lead conductors, to provide each ceramic laminated product. The resultant ceramic laminated product is fired. Subsequently, outer electrodes are formed on the surface of the ceramic laminated product to provide a final product.

When the inner conductors and the lead conductors are formed by normal screen printing, the conductors have a thickness of about 20 μm. With such a thickness, when the mother ceramic laminated block is cut, mechanical stress applied to the lead conductors is small. Therefore, defects such as cracking are typically not generated.

Japanese Unexamined Patent Application Publication No. 2002-305123 discloses a method for producing a conductor for a coil. According to this method, a conductor layer for a coil integrated with a lead portion is transferred a plurality of times so as to overlap each other. Thus, a conductor for a coil having a conductor thickness after the firing of, for example, about 70 μm to about 80 μm is produced.

However, with such a large thickness of the conductor, when the mother ceramic laminated block is cut, excessive mechanical stress is applied to the lead portion of the conductor for a coil. As a result, defects such as cracking are often generated.

Further, it is known that ferrite has the magnetostrictive effect in which the permeability is changed depending on the stress. The production of a laminated ceramic electronic component has the following problem. When laminated green sheets including ferrite and inner conductors are fired, stress caused by the difference in the shrinking characteristics is applied to the ferrite. Consequently, the permeability of the ferrite is decreased.

SUMMARY OF THE INVENTION

To overcome the problems described above, preferred embodiments of the present invention provide a laminated ceramic electronic component having a structure in which excessive mechanical stress is not easily or readily applied to a lead conductor during cutting and a method for producing the same.

In addition, preferred embodiments of the present invention provide a method for producing a laminated ceramic electronic component in which a decrease in the permeability due to the magnetostrictive effect is prevented.

A laminated ceramic electronic component according to a preferred embodiment of the present invention includes an inner conductor provided inside of a ceramic laminated product, an outer electrode provided on the surface of the ceramic laminated product, and a lead conductor connecting the inner conductor to the outer electrode, wherein the thickness of the lead conductor is less than the thickness of the inner conductor. Examples of the inner conductor include a conductor for a coil and a high frequency line conductor such as a strip line.

According to the structure described above, the thickness of the lead conductor is small. Therefore, although mechanical stress during cutting is directly applied to the lead conductor, the mechanical stress applied to the lead conductor during cutting is reduced.

A method for producing a laminated ceramic electronic component according to a preferred embodiment of the present invention includes the steps of preparing ceramic green sheets, transferring an inner conductor pattern layer and a lead conductor pattern layer formed on a support on the ceramic green sheets in order to form the inner conductor and the lead conductor on the ceramic green sheets, laminating the ceramic green sheets so as to cover the inner conductor and the lead conductor, and firing the ceramic laminated product.

In the step of forming the inner conductor and the lead conductor, the inner conductor pattern layer is transferred onto the ceramic green sheet a plurality of times so as to overlap each other, thereby forming the inner conductor. In addition, the lead conductor pattern layer is transferred onto the ceramic green sheet, wherein the number of times of the transferring is less than the number of times of the transferring of the inner conductor pattern layer, thereby forming the lead conductor having a thickness that is less than the thickness of the inner conductor.

During mass production, the ceramic laminated product formed by laminating a plurality of ceramic green sheets is provided as a mother ceramic laminated block including a plurality of ceramic laminated products. The mother ceramic laminated block is cut according to the arrangement of the inner conductor formed inside thereof to provide each ceramic laminated product. The resultant ceramic laminated product is then fired.

According to the method described above, a laminated ceramic electronic component in which the thickness of the inner conductor is greater than that of a conventional electronic component and the thickness of the lead conductor is less than that of the inner conductor is produced.

A small thickness of the lead conductor decreases the cross-sectional area of the lead conductor so as to increase the direct current resistance. Accordingly, the conductor width of the lead conductor is preferably greater than the conductor width of the inner conductor. Thus, the decrease in the cross-sectional area of the lead conductor is compensated for. As a result, the increase in the direct current resistance caused by decreasing the thickness of the lead conductor is prevented.

The metal content of conductive paste used for forming the lead conductor pattern layer is preferably greater than that of conductive paste used for forming the inner conductor pattern layer. Even if cracks are generated on the lead portion during cutting, the conductive paste is melted during the firing and a metal in the conductive paste fills the cracks.

Among the inner conductor pattern layers, at least the inner conductor pattern layer that is in contact with the ceramic green sheet is preferably formed with conductive paste including resin particles that are consumed during the firing process. When the resin particles are consumed during the firing process, a space is formed between the ceramic green sheet and the inner conductor. As a result, the stress applied to the ceramic green sheet (ferrite) is reduced to prevent the decrease in the permeability caused by the magnetostrictive effect. Furthermore, the formation of this space prevents cracks from generating on the inner conductor.

As described above, according to preferred embodiments of the present invention, the thickness of a lead conductor is less than that of an inner conductor. Accordingly, the mechanical stress applied to the lead conductor during cutting is reduced. As a result, defects, such as cracking generated on the lead conductor during cutting, are prevented.

In addition, among inner conductor pattern layers, at least an inner conductor pattern layer that is in contact with ceramic green sheets is formed with conductive paste including resin particles that are consumed during the firing process. Accordingly, the decrease in the permeability caused by the magnetostrictive effect is prevented.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of a laminated ceramic electronic component according to the present invention and a method for producing the same will now be described with reference to the attached drawings.

Figure 1:
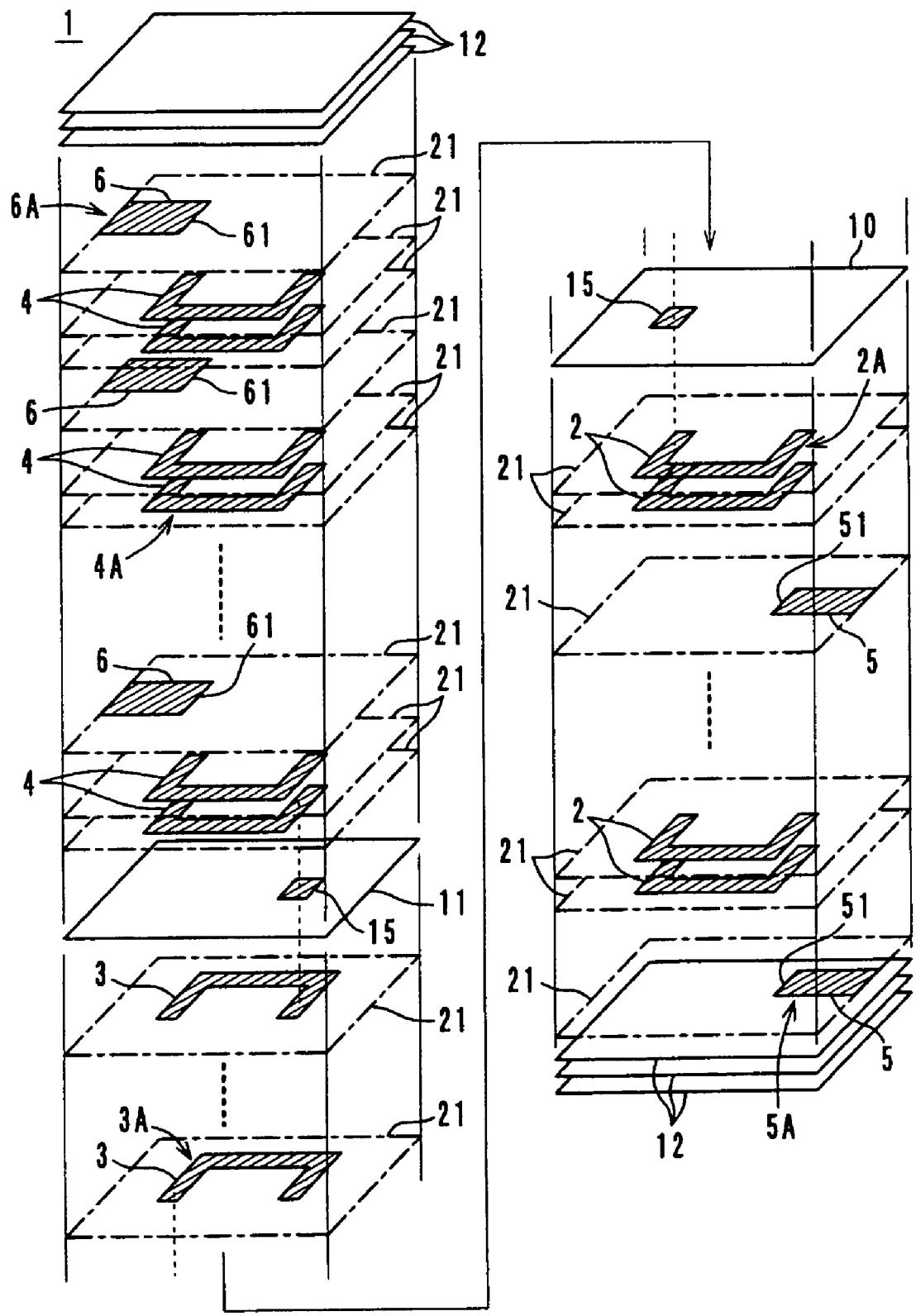
FIG. 1 is an exploded perspective view for explaining a preferred embodiment of a laminated ceramic electronic component according to the present invention.

As shown in FIG. 1, a laminated inductor 1 includes, for example, conductor pattern layers 2, 3, and 4 for a coil, lead conductor pattern layers 5 and 6, and ceramic green sheets 10, 11, and 12. Reference numeral 21 indicates a support (carrier film). As will be described below, the support (carrier film) 21 is eventually removed and is not included in the laminated inductor 1.

The ceramic green sheets 10 to 12 are formed as follows. For example, a Fe—Ni—Cu-containing ferrite powder or a glass ceramic powder is mixed with a binder. The mixture is formed by, for example, a doctor blade method so as to have a sheet shape. The ceramic green sheets 12 are used for outer layers, whereas the ceramic green sheets 10 and 11 are used as inner layers.

Via holes 15 for inner layer connection are provided in the ceramic green sheets 10 and 11 defining the inner layers. The via holes 15 for inner layer connection are formed as follows. Through-holes are formed in the sheets 10 and 11 with, for example, a laser beam. Conductive paste including, for example, Ag, Pd, Cu, Au, or an alloy thereof is then filled in the through-holes by printing, or other suitable method.

In order to form each of the conductor pattern layers 2, 3, and 4 for a coil and the lead conductor pattern layers 5 and 6, conductive paste is applied on a support made of a PET film or a PP film by, for example, screen printing, photolithography or other suitable method. These conductor pattern layers 2 to 6 are made of, for example, Ag, Pd, Cu, Au, or an alloy thereof. In this preferred embodiment, the conductor pattern layers 2, 3, and 4 for a coil preferably have a U shape. Alternatively, the conductor pattern layers 2, 3, and 4 for a coil may have, for example, a straight line shape, a circular arc shape, a spiral shape, or any other suitable shape.

Furthermore, in this preferred embodiment, the metal content (i.e., the ratio of metal powder to the total amount of paste) of a conductive paste used for forming the lead conductor pattern layers 5 and 6 is greater than that of a conductive paste used for forming the conductor pattern layers 2 to 4 for a coil. More specifically, for example, the metal content of the conductive paste used for forming the conductor pattern layers 2 to 4 for a coil is approximately 50%. On the other hand, the metal content of the conductive paste used for forming the lead conductor pattern layers 5 and 6 is approximately 70%.

The conductive paste having a high metal content has the following advantage. Even if cracks are generated on the lead conductor pattern layer 5 or 6 during cutting, the conductive paste is melted during the firing and the metal powder in the conductive paste fills the cracks. Accordingly, connection defects are more effectively prevented. In contrast, in the conductive paste having a lower metal content, even when the conductive paste is melted during the firing, the crack cannot be filled satisfactorily because the amount of the metal powder is insufficient. In addition, since the conductive paste having a higher metal content is expensive, such a conductive paste is used for only the lead conductor pattern layers 5 and 6 in which cracks are more likely to be generated.

A plurality of conductor pattern layers 2, 3, and 4 for a coil overlap each other to form U-shaped conductors 2A, 3A, and 4A for a coil. The conductors 2A, 3A, and 4A for a coil are electrically connected in series by the via holes 15 for inner layer connection provided in the ceramic green sheets 10 and 11 to form a spiral coil L. The coil axis of the coil L extends in a direction that is substantially parallel to the laminating direction of the sheets 10 to 12.

Meanwhile, a plurality of lead conductor pattern layers 5 and 6 also overlap each other to form lead conductors 5A and 6A. One end of the lead conductor 5A is exposed on the right side of the sheets 12. Another end of the lead conductor 5A is electrically connected to an end of the conductor 2A for the coil. In other words, one lead conductor pattern layer 5 is disposed per a predetermined number (two layers in this preferred embodiment) of conductor pattern layers 2 for the coil, and an end 51 of each lead conductor pattern layer 5 is in contact with the corresponding conductor pattern layer 2 for the coil. This structure increases the contact area between the lead conductor 5A and the conductor 2A for the coil. As a result, the lead conductor 5A is electrically connected to the conductor 2A to improve the coil reliably.

In the same manner, one end of the lead conductor 6A is exposed on the left side of the sheets 12. Another end of the lead conductor 6A is electrically connected to an end of the conductor 4A for the coil. In other words, one lead conductor pattern layer 6 is disposed per a predetermined number of conductor pattern layers 4 for the coil, and an end 61 of each lead conductor pattern layer 6 is in contact with the corresponding conductor pattern layer 4 for the coil.

With this structure, the thickness of the lead conductors 5A and 6A is less than that of the conductors 2A to 4A for the coil. More specifically, the conductor pattern layers 2 to 4 for the coil and the lead conductor pattern layers 5 and 6 are formed so as to have a thickness of about 10 µm. In addition, the number of overlaps for each conductor pattern layer 2, 3, or 4 for the coil is preferably about 10. Consequently, after the firing, each of the conductors 2A to 4A for the coil has a thickness of about 70 µm to about 80 µm. On the other hand, the number of overlaps for lead conductor pattern layer 5 is about 5. Consequently, after the firing, each of the lead conductors 5A and 6A preferably has a thickness of about 35 µm to about 40 µm, for example.

Since the lead conductors 5 and 6 have a reduced thickness, as will be described below, mechanical stress applied to the lead conductors 5A and 6A during cutting is greatly reduced. Accordingly, the generation of cracks on the lead conductors 5A and 6A during cutting is prevented.

Furthermore, the lead conductor pattern layers 5 and 6 have a conductor width greater than the conductor width of the conductor pattern layers 2 to 4 for the coil. Therefore, the conductor width of the lead conductors 5A and 6A is greater than the conductor width of the conductors 2A to 4A for the coil.

A small thickness of the lead conductors 5A and 6A decreases the cross-sectional area of the lead conductors 5A and 6A which increases the direct current resistance. Accordingly, the lead conductors 5A and 6A have a conductor width greater than that of the conductors 2A to 4A for the coil in order to compensate for the decrease in the cross-sectional area of the lead conductors 5A and 6A. Thus, the increase in the direct current resistance caused by decreasing the thickness of the lead conductors 5A and 6A is prevented.

Figure 2:
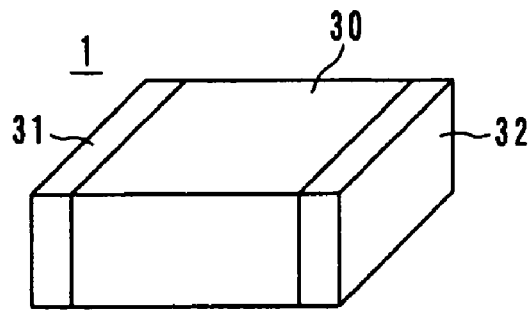
FIG. 2 is an outside perspective view of the laminated ceramic electronic component shown in FIG. 1.
Figure 3:
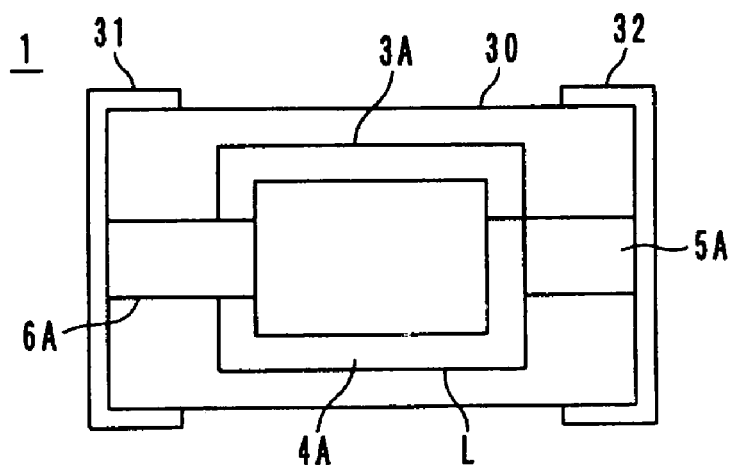
FIG. 3 is a perspective plan view of the inside of the laminated ceramic electronic component shown in FIG. 1.

The conductor pattern layers 2, 3 and 4 for the coil, the lead conductor pattern layers 5 and 6, and the ceramic green sheets 10, 11, and 12 are laminated as shown in FIG. 1. The laminated product is then fired as a single component to provide a ceramic laminated product 30 having a substantially rectangular shape, as shown in FIG. 2. Input-output outer electrodes 31 and 32 are provided at right and left end surfaces of the ceramic laminated product 30. As shown in FIG. 3, both ends of the spiral coil L are electrically connected to the input-output outer electrodes 31 and 32, with the lead conductors 5A and 6A therebetween.

A method for producing the laminated inductor 1 having the above-described structure will now be described with reference to FIGS. 4 to 15. FIGS. 4 to 15 show only a single ceramic laminated product. In the actual process, however, a mother ceramic laminated block including a plurality of ceramic laminated products is formed. Subsequently, the mother ceramic laminated block is cut according to the arrangement of the conductors 2A to 4A for a coil and the lead conductors 5A and 6A to provide each ceramic laminated product.

Figure 4:
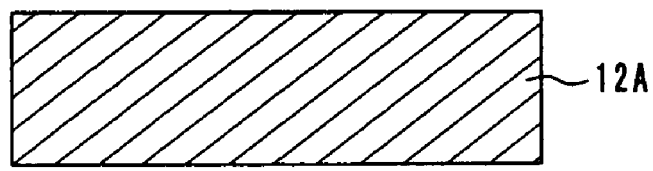
FIG. 4 is a schematic cross-sectional view showing an example of a method for producing a laminated ceramic electronic component according to the present invention.
Figure 5:
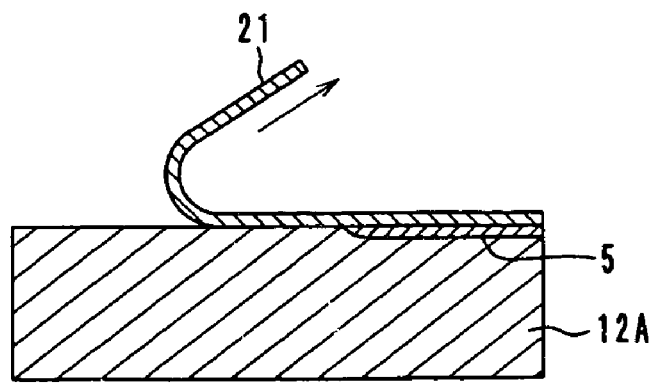
FIG. 5 is a schematic cross-sectional view showing the step following the step shown in FIG. 4.

First, a plurality of ceramic green sheets 12 is laminated and compression bonded to provide a mother ceramic outer layer block 12A (see FIG. 4). Subsequently, as shown in FIG. 5, a lead conductor pattern layer 5 is disposed on the mother ceramic outer layer block 12A such that a support 21 is disposed at the upper side of the mother ceramic outer layer block. The resultant mother ceramic outer layer block 12A is then compression bonded by a pressing machine to embed the lead conductor pattern layer 5 in the mother ceramic outer layer block 12A. The support 21 is then peeled off. Thus, the lead conductor pattern layer 5 is transferred on the mother ceramic outer layer block 12A.

Figure 6:
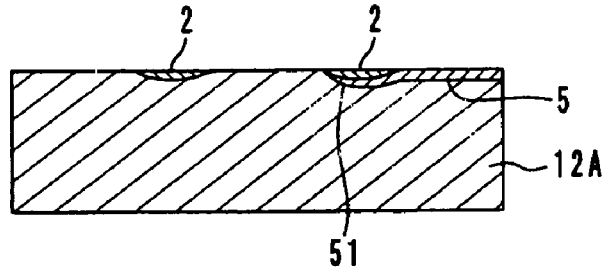
FIG. 6 is a schematic cross-sectional view showing the step following the step shown in FIG. 5.

Subsequently, as shown in FIG. 6, a conductor pattern layer 2 for a coil is disposed on the mother ceramic outer layer block 12A such that an end of the conductor pattern layer 2 for the coil is in contact with an end 51 of the lead conductor pattern layer 5. Herein, the conductor pattern layer 2 for the coil is disposed such that a support 21 is disposed at the upper side thereof. Subsequently, the conductor pattern layer 2 for the coil is embedded in the mother ceramic outer layer block 12A by compression bonding. The support 21 is then peeled off. Thus, the conductor pattern layer 2 for the coil is transferred on the mother ceramic outer layer block 12A.

Figure 7:
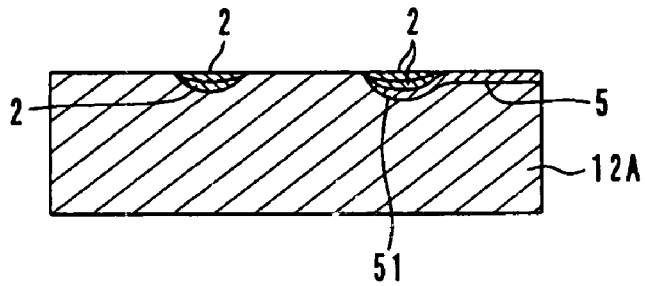
FIG. 7 is a schematic cross-sectional view showing the step following the step shown in FIG. 6.

Subsequently, as shown in FIG. 7, another conductor pattern layer 2 for the coil is disposed on the mother ceramic outer layer block 12A so as to overlap the above-described conductor pattern layer 2 for the coil that is previously transferred. Herein, the conductor pattern layer 2 for the coil is disposed such that a support 21 is disposed at the upper side thereof. Subsequently, the conductor pattern layer 2 for the coil is embedded in the mother ceramic outer layer block 12A by compression bonding. The support 21 is then peeled off. Thus, the conductor pattern layer 2 for the coil is transferred on the mother ceramic outer layer block 12A.

Figure 8:
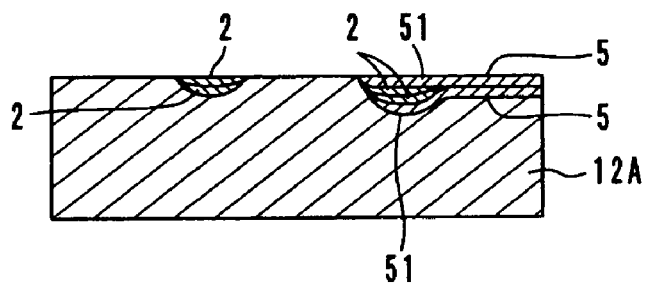
FIG. 8 is a schematic cross-sectional view showing the step following the step shown in FIG. 7.

Subsequently, as shown in FIG. 8, another lead conductor pattern layer 5 is disposed on the mother ceramic outer layer block 12A so as to overlap with the above-described lead conductor pattern layer 5 that is previously transferred. Herein, the lead conductor pattern layer 5 is arranged such that a support 21 is disposed at the upper side thereof. The end 51 of the lead conductor pattern layer 5 is in contact with an end of the conductor pattern layer 2 for the coil. Subsequently, the lead conductor pattern layer 5 is embedded in the mother ceramic outer layer block 12A by compression bonding. The support 21 is then peeled off. Thus, the lead conductor pattern layer 5 is transferred on the mother ceramic outer layer block 12A.

Figure 9:
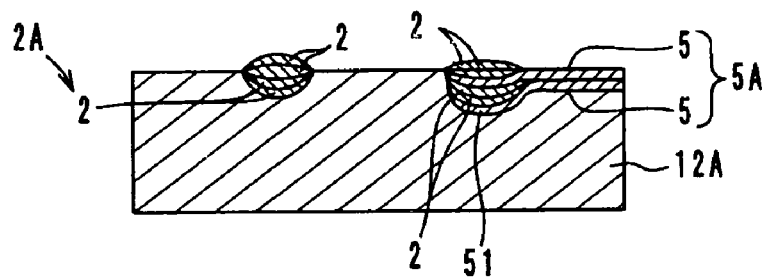
FIG. 9 is a schematic cross-sectional view showing the step following the step shown in FIG. 8.

Subsequently, the above-described transferring of the conductor pattern layer 2 for the coil is repeated two times. As a result, as shown in FIG. 9, two conductor pattern layers 2 for the coil are laminated. The transferring is repeated preferably at a ratio of two conductor pattern layers 2 for the coil to one lead conductor pattern layer 5, for example. Thus, a conductor 2A for a coil including ten conductor pattern layers 2 for the coil and a lead conductor 5A including five lead conductor pattern layers 5 are formed. In order to simplify the drawings, the subsequent drawings show a conductor 2A for the coil including four layers and a lead conductor 5A including two layers (other conductors 3A and 4A for the coil and another lead conductor 6A are also shown in the same manner).

Figure 10:
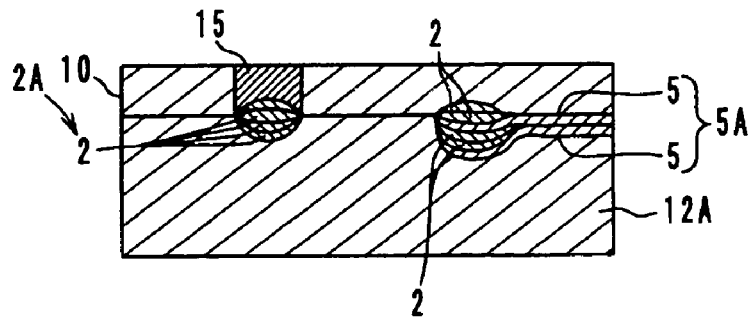
FIG. 10 is a schematic cross-sectional view showing the step following the step shown in FIG. 9.
Figure 11:
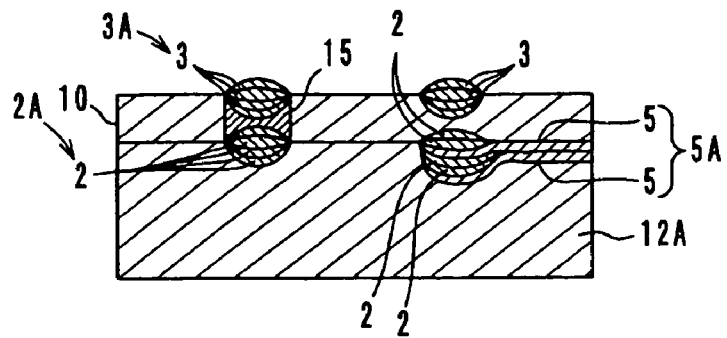
FIG. 11 is a schematic cross-sectional view showing the step following the step shown in FIG. 10.

Subsequently, as shown in FIG. 10, a ceramic green sheet 10 having a via hole 15 for inner layer connection is laminated on the mother ceramic outer layer block 12A. Subsequently, the transferring of a conductor pattern layer 3 for the coil is repeated ten times on the ceramic green sheet 10 as in the above-described method, such that the conductor pattern layers 3 for the coil overlap with each other (see FIG. 11). As a result, a conductor 3A for the coil including ten conductor pattern layers 3 for the coil is formed. The conductor 3A for the coil is electrically connected to the conductor 2A for the coil, with the via hole 15 for inner layer connection therebetween. In these steps, compression bonding is performed after each transferring in order to embed the conductor pattern layers 3 for the coil in the ceramic green sheet.

Figure 12:
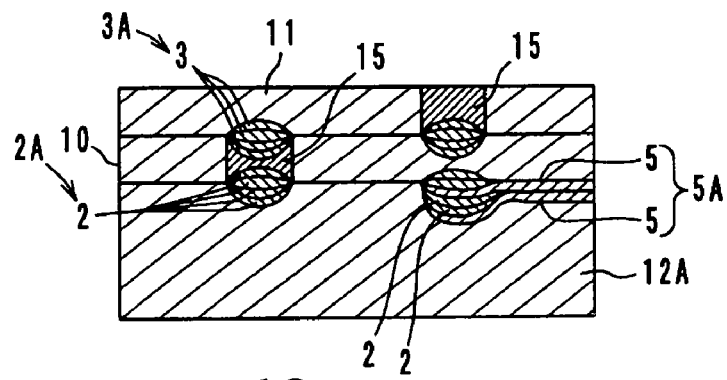
FIG. 12 is a schematic cross-sectional view showing the step following the step shown in FIG. 11.

Subsequently, as shown in FIG. 12, a ceramic green sheet 11 having a via hole 15 for inner layer connection is laminated.

Figure 13:
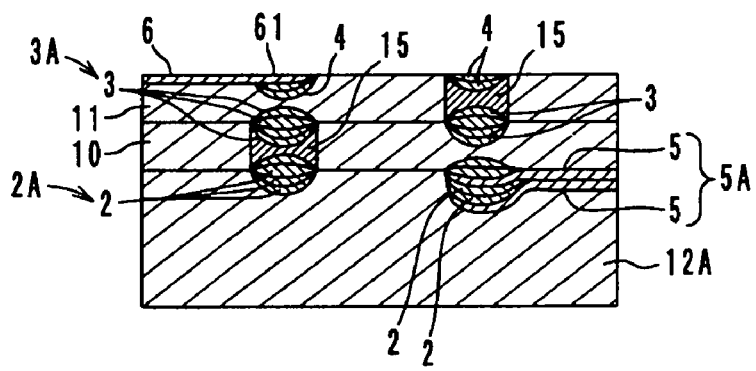
FIG. 13 is a schematic cross-sectional view showing the step following the step shown in FIG. 12.

Subsequently, as shown in FIG. 13, the transferring of a conductor pattern layer 4 for the coil is repeated two times. As a result, two conductor pattern layers 4 for the coil are laminated on the ceramic green sheet 11. Furthermore, a lead conductor pattern layer 6 is transferred thereon such that an end 61 of the lead conductor pattern layer 6 is in contact with an end of the conductor pattern layer 4 for the coil. In these steps, compression bonding is performed after each transferring step in order to embed the conductor pattern layers 4 for the coil and the lead conductor pattern layer 6 in the ceramic green sheet.

Figure 14:
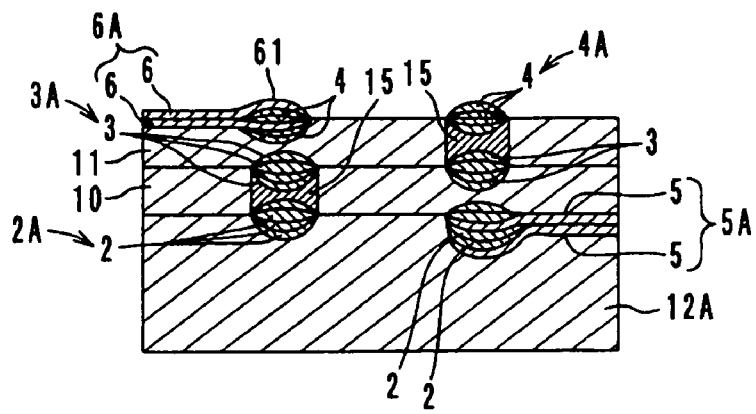
FIG. 14 is a schematic cross-sectional view showing the step following the step shown in FIG. 13.

Thus, the transferring step is repeated at a ratio of one lead conductor pattern layer 6 to two conductor pattern layers 4 for the coil. As shown in FIG. 14, a conductor 4A for a coil including ten conductor pattern layers 4 for the coil and a lead conductor 6A including five lead conductor pattern layers 6 are formed. The conductor 4A for the coil is electrically connected to the conductor 3A for the coil, with the via hole 15 for inner layer connection therebetween.

Figure 15:
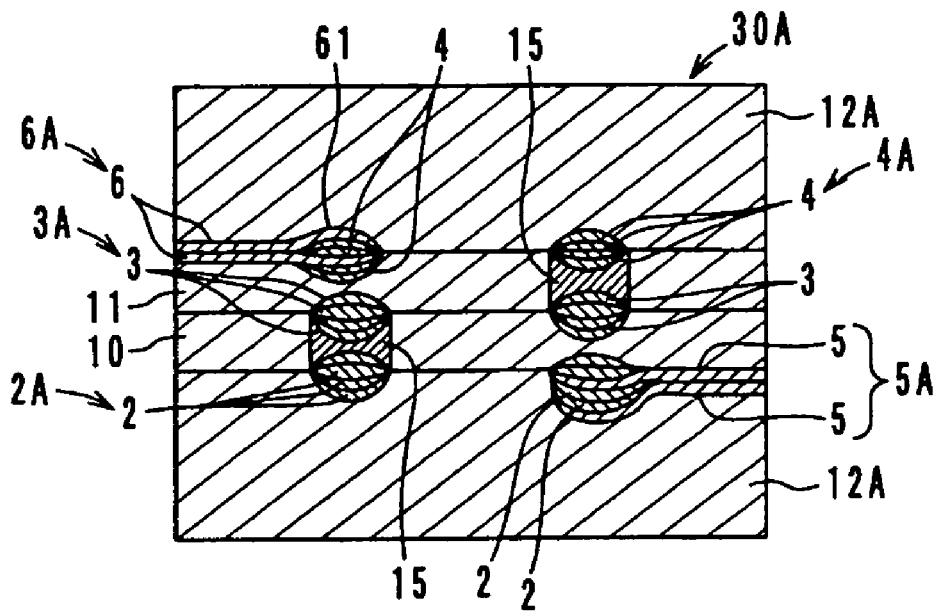
FIG. 15 is a schematic cross-sectional view showing the step following the step shown in FIG. 14.

Furthermore, as shown in FIG. 15, a plurality of ceramic green sheets 12 is laminated thereon and is compression bonded to provide a mother ceramic laminated block 30A. This mother ceramic laminated block 30A is cut according to the arrangement of the conductors 2A to 4A for the coil and the lead conductors 5A and 6A. In general, the lead conductors 5A and 6A are formed to extend over the cutting line to accommodate for tolerances in production. Therefore, mechanical stress during cutting is directly applied to the lead conductors 5A and 6A. However, since the lead conductors 5A and 6A have a reduced thickness, the mechanical stress applied to the lead conductors 5A and 6A during cutting is reduced. As a result, the generation of cracks on the lead conductors 5A and 6A during cutting is prevented.

Specifically, the thickness of the conductors 2A to 4A for the coil after the firing was controlled to be about 80 μm and the thickness of the lead conductors 5A and 6A after the firing was controlled to be about 80 μm, for example. In this known structure, the ratio of crack generation on the lead conductors 5A and 6A was about 35%. In contrast, the thickness of the conductors 2A to 4A for the coil after the firing was controlled to be about 80 μm, for example, the thickness of the lead conductors 5A and 6A after the firing was controlled to be about 40 μm, for example, and the conductor width of the lead conductors 5A and 6A after the firing was controlled to be double that of the known structure, for example. In this laminated inductor 1 according to this preferred embodiment of the present embodiment, the ratio of crack generation on the lead conductors 5A and 6A was 0%.

Each of the ceramic laminated products 30 cut from the mother ceramic laminated block 30A is fired. Subsequently, input-output outer electrodes 31 and 32 are formed at right and left end surfaces of the ceramic laminated product. The input-output outer electrodes 31 and 32 are formed by, for example, applying and baking, sputtering, vapor deposition or other suitable method.

When a ceramic green sheet including ferrite is integrated with a conductor pattern layer for a coil and the integrated component is fired, stress caused by the difference in the shrinking characteristics is generated. Consequently, the permeability is decreased by the magnetostrictive effect specific to ferrite. Accordingly, among the conductor pattern layers 2, 3, and 4 for the coil, at least the conductor pattern layer for the coil that is in contact with the ceramic green sheet 10, 11, or 12 is formed with conductive paste including resin particles that are consumed during the firing process. As a result, the decrease in the permeability caused by the magnetostrictive effect is prevented.

In other words, conductive paste including conductive particles, resin particles, and an organic vehicle is used as the conductive paste of the conductor pattern layer for the coil that is in contact with the ceramic green sheet. The volume ratio of the resin particles to the conductive particles is preferably about 0.5 to about 1. The total amount of the resin particles and the conductive particles is preferably about 30 to about 60 volume percent. Resin particles that are consumed during at the firing temperature of the conductive particles or a lower temperature are selected.

More specifically, examples of the conductive particles include Ag, Pd, Pt, Au, Ni, Cu, a mixture thereof, and an alloy thereof. Examples of the resin particles having excellent thermal decomposition characteristics include acrylic, methacrylic, polypropylene, polyethylene, polystyrene, polyester, polyolefin, polyisobutylene, and polyethylene glycol resin particles. Polymethylmethacrylate resin having a large compressive strength may be used.

The organic vehicle contained in such a conductive paste includes an organic binder and a solvent. Examples of the organic binder include ethylene cellulose, acrylic, and butyral resins. Examples of the solvent include α-terpineol, tetralin, and butyl carbitol. The organic vehicle is prepared such that the ratio of the organic binder to the solvent is, for example, about 1:9.

Thus, among the conductor pattern layers 2, 3, and 4 for the coil, at least the conductor pattern layer for the coil that is brought into contact with the ceramic green sheet 10, 11, or 12 is formed using conductive paste including resin particles that are consumed during the firing process. In such a case, the resin particles are consumed during the firing process to form a space between the ceramic green sheet and the inner conductor. As a result, the stress applied to the ceramic green sheet (ferrite) is minimized and greatly reduced to prevent the decrease in the permeability due to the magnetostrictive effect. Furthermore, the formation of this space prevents cracks from generating on the inner conductor.

The conductive paste including the resin particles includes a relatively small amount of conductive component. Therefore, in order to provide a reliable connection between the lead conductor pattern layers and the conductor pattern layers for a coil, preferably, the lead conductor pattern layers are not connected to the conductor pattern layers for the coil composed of the conductive paste including the resin particles.

Figure 16:
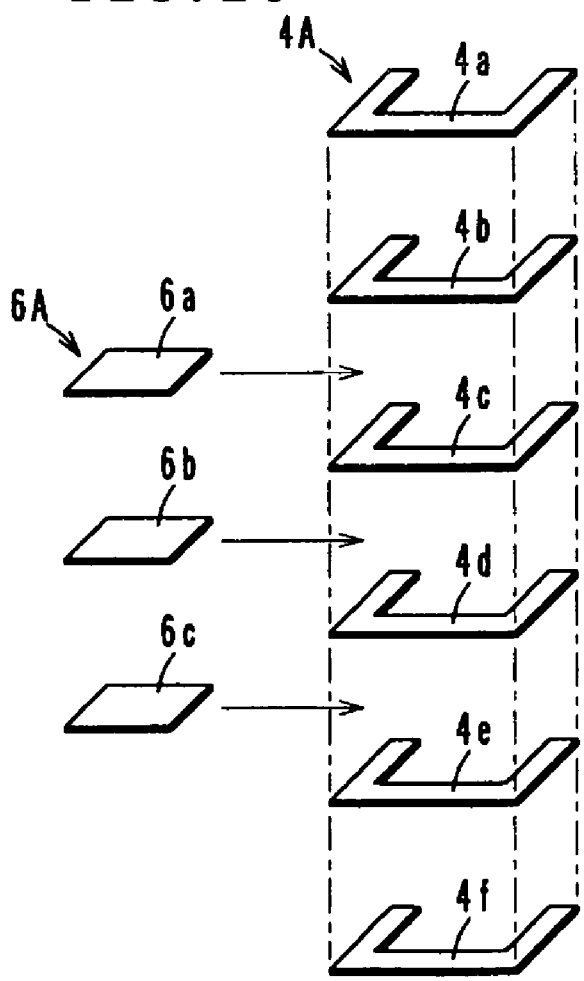
FIG. 16 is a perspective view showing an example of a connecting relationship between conductor pattern layers for a coil and lead pattern layers that is preferable to prevent the decrease in permeability.

In order to prevent the decrease in the permeability, FIG. 16 shows an example of a preferable connecting relationship between conductor pattern layers for a coil and lead conductor pattern layers. That is, a conductor 4A for a coil includes conductor pattern layers 4a to 4f for the coil, and a lead conductor 6A includes lead conductor pattern layers 6a to 6c.

In this case, conductor pattern layers 4a and 4f for the coil, which are brought into contact with the ceramic green sheets 12 and 11, respectively (see FIG. 1), are formed using conductive paste including resin particles that are consumed during the firing process. Conductor pattern layers 4b to 4e for the coil formed using conductive paste that does not include such resin particles are connected to the lead conductor pattern layers 6a to 6c.

The use of conductive paste including the resin particles as the lead conductor pattern layers 5 and 6 is not necessarily preferable. The reason for this is as follows. When a space is formed between the lead conductor pattern layer 5 or 6 and a ceramic green sheet, a problem, for example, the entering of a plating solution from the outside may occur.

The present invention is not limited to the above-described preferred embodiments and can be modified within the scope of the content. In addition to the laminated inductor, examples of the laminated ceramic electronic component include a laminated common mode choke coil, a laminated transformer, a laminated impedance component, a laminated LC filter, and a high frequency line device having a strip line or a micro strip line.

In the above-described preferred embodiment, one lead conductor pattern layer 5 and two conductor pattern layers 2 for a coil are transferred alternately. These layers are not necessarily transferred alternately. For example, after all the conductor pattern layers 2 for a coil are transferred, the lead conductor pattern layers 5 may be transferred.

Figure 17:
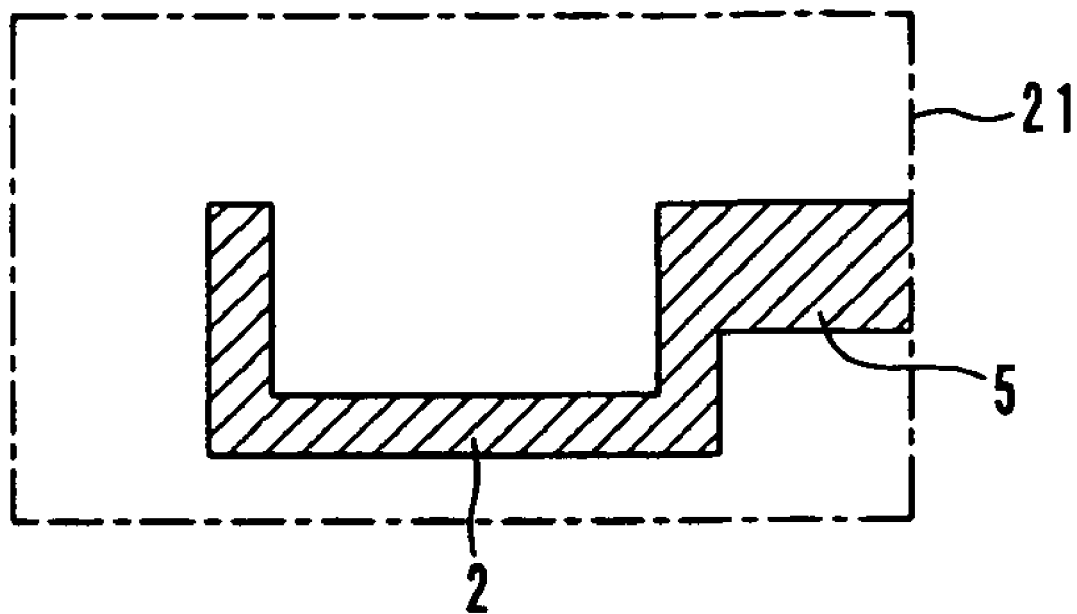
FIGS. 17 and 18 include plan views showing modifications.
Figure 18:
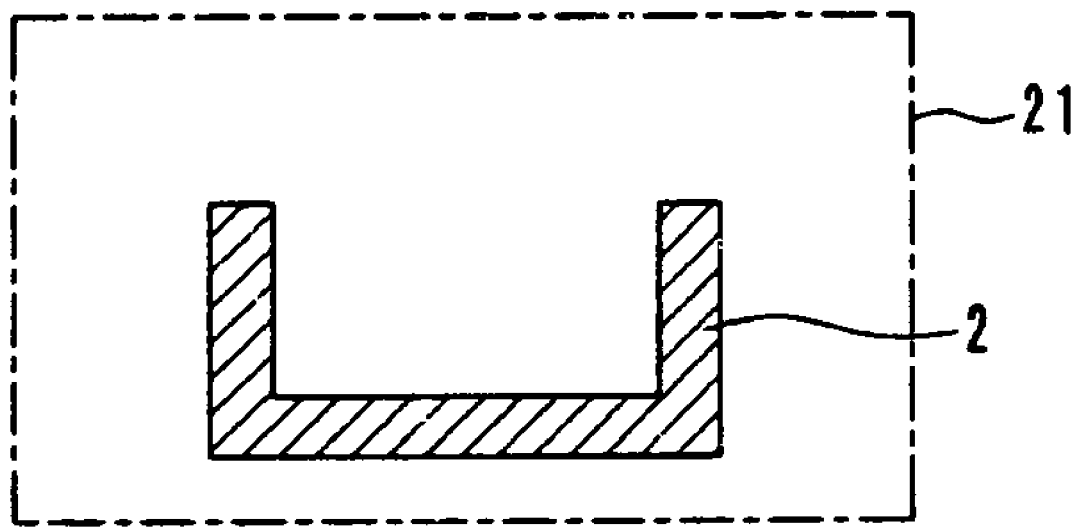

Furthermore, in the above-described preferred embodiment, the lead conductor pattern layer 5 and the conductor pattern layer 2 for a coil are preferably formed separately. Alternatively, the lead conductor pattern layer 5 and the conductor pattern layer 2 for a coil may be formed at the same time. For example, as shown in FIG. 17(A), a lead conductor pattern layer 5 and a conductor pattern layer 2 for a coil are formed as an integrated element on a carrier film 21. As shown in FIG. 17(B), only the conductor pattern layer 2 for the coil is formed on a carrier film 21. Subsequently, these carrier films may be transferred alternately.

The method for producing a laminated ceramic electronic component according to preferred embodiments of the present invention is not limited to a method in which an inner conductor and a lead conductor are formed by transferring. Alternatively, in the method, the inner conductor and the lead conductor may be formed on a ceramic green sheet by, for example, screen printing.

As described above, the present invention is useful for a laminated inductor, a laminated impedance component, a laminated transformer, a high frequency line device, and other suitable devices. In particular, with the present invention, excessive mechanical stress is not readily applied to a lead conductor during cutting.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

The invention claimed is:

1. A laminated ceramic electronic component comprising:
a ceramic laminated member including a plurality of ceramic layers;
an inner conductor provided inside of the ceramic laminated member;
an outer electrode provided on the surface of the ceramic laminated member; and
a lead conductor connecting the inner conductor to the outer electrode; wherein
a thickness of the lead conductor is less than a thickness of the inner conductor;
the lead conductor includes a plurality of lead conductor pattern layers that overlap and are in contact with each other;
the inner conductor includes a plurality of inner conductor pattern layers that overlap and are in contact with each other;
the number of lead conductor pattern layers of the plurality of lead conductor pattern layers provided on a first ceramic layer of the plurality of ceramic layers is less than the number of inner conductor pattern layers of the plurality of inner conductor pattern layers provided on the first ceramic layer of the plurality of ceramic layers.

2. The laminated ceramic electronic component according to claim 1, wherein a conductor width of the lead conductor is greater than a conductor width of the inner conductor.

3. The laminated ceramic electronic component according to claim 1, wherein the inner conductor defines a coil.

4. The laminated ceramic electronic component according to claim 1, wherein a metal content of the lead conductor is greater than a metal content of the inner conductor.

5. The laminated ceramic electronic component according to claim 1, wherein the thickness of the inner conductor is in the range of about 70 μm to about 80 μm, and the thickness of the lead conductor is in the range of about 35 μm to about 40 μm.

6. The laminated ceramic electronic component according to claim 1, wherein the number of inner conductor pattern layers is 10 and the number of lead conductor pattern layers is 5.

7. The laminated ceramic electronic component according to claim 1, wherein at least one of the inner conductor pattern layers is made of a conductive paste including resin particles having thermal decomposition characteristics sufficient such that the resin particles are consumed when subjected to firing.

8. The laminated ceramic electronic component according to claim 1, wherein each of the plurality of inner conductor pattern layers is substantially U-shaped.

9. The laminated ceramic electronic component according to claim 1, wherein the inner conductor is a spiral coil.

* * * * *